United States Patent [19]

Sanyigo et al.

[11] Patent Number: 5,736,913
[45] Date of Patent: Apr. 7, 1998

[54] METHOD AND APPARATUS FOR PROVIDING GROUNDING TO MICROWAVE CIRCUIT BY LOW IMPEDANCE MEANS

[75] Inventors: Kenneth S. Sanyigo, Fords; Raymond M. Waugh, Phillipsburg; John T. Bayruns, Middlesex, all of N.J.

[73] Assignee: Anadigics, Inc., Warren, N.J.

[21] Appl. No.: 601,499

[22] Filed: Feb. 14, 1996

[51] Int. Cl.⁶ .................................................. H01P 1/00
[52] U.S. Cl. .................. 333/246; 257/728; 327/564; 333/99 R
[58] Field of Search ................ 333/12, 246, 247, 333/263, 99 R; 327/564; 257/664, 728, 735

[56] References Cited

U.S. PATENT DOCUMENTS 4,617,586 10/1986 Cuvilliers et al. ............... 333/247 X
4,686,492 8/1987 Grellmann et al. ............... 333/246 X
5,208,560 5/1993 Yasutake ............................ 333/12

Primary Examiner—Paul Gensler
Attorney, Agent, or Firm—Pennie & Edmonds LLP

[57] ABSTRACT

Low impedance means are provided for coupling a common circuit ground of a microwave circuit to the ground potential. The low impedance means include a plurality of resonators, each having a distinct resonant frequency at which it displays a minimum impedance. The resonant frequencies of the resonators are chosen and arranged such that the resonators together operate to provide a low impedance band in the frequency spectrum within which low impedance coupling between the common circuit ground and the ground potential is achieved. In a preferred embodiment, resonators include capacitors connected in series with inductive bonding wires, and different resonant frequencies are obtained by using capacitors with different capacitance.

20 Claims, 6 Drawing Sheets

METHOD AND APPARATUS FOR PROVIDING GROUNDING TO MICROWAVE CIRCUIT BY LOW IMPEDANCE MEANS

FIELD OF THE INVENTION

This invention relates to microwave device and more particularly, to providing grounding to microwave circuit by low impedance means.

BACKGROUND OF THE INVENTION

It is well known to those skilled in the art the importance of providing grounding to a microwave circuit by low impedance means, particularly where the microwave circuit is to operate at a high frequency. A reference point in a microwave circuit that is to be connected to ground is called a "common circuit ground". For a monolithic microwave integrated circuit ("MMIC"), such reference point is also called an "on-chip ground". Ideally, when connected to ground by a conductor, the common circuit ground should be at ground potential. In reality, however, due to the impedance of the conductor, the potential of the common circuit ground often deviates from ground.

Such deviation is rarely a problem for microwave circuit operating at low frequencies. The impedance of the conductor connecting the common circuit ground to ground is mainly due to the inductance of such conductor, and it is proportional to signal frequency. At low frequencies, such impedance is rather small and as a result, the common circuit ground is close to ground.

For a microwave circuit operating at high frequencies, however, the deviation of common circuit ground from ground may become significant. In severe cases, the common circuit ground is so different from ground that it causes the circuit to oscillate. In the worst case, a microwave circuit may cease to operate. With today's continuing demand for increased signal frequencies, there is a need to develop low impedance means for connecting the common circuit ground to ground.

The deviation of the common circuit ground from true ground also creates a major design problem: In designing a microwave circuit, the common circuit ground is usually used as true ground in design simulations. Consequently, when in fact the common circuit ground is very different from true ground, the performance of a microwave circuit actually fabricated in accordance with a design will be quite different from the expected performance of the circuit. More design iterations and more test circuit fabrication will be required in order to achieve desired performance, thus increasing the duration and cost for developing a microwave circuit.

Bonding wires are most commonly used to connect a common circuit ground to ground. As illustrated in FIGS. 1A and 1B, a microwave integrated circuit 100 is formed on a semiconductor substrate 105. Microwave circuit 100 includes an on-chip ground 110 having a bonding area 115. A bonding wire 130 is used to connect bonding area 115 to a package ground 125. Package ground 125 is connected to ground potential usually by low impedance means. Thus, grounding is provided to microwave circuit 100 through package ground 125, bonding wire 130, bonding pad 115 and on-chip ground 110.

FIG. 1B depicts a more detailed view of the connection between the on-chip ground and package ground by a bonding wire. Although the use of bonding wires is simple and inexpensive, it is not suitable for high frequency applications because of the relatively high impedance associated with bonding wires.

One improved method to providing grounding to a microwave circuit involves a plated via hole structure. As depicted in FIG. 1C, such structure contains via holes 150 formed in a substrate 140. On a front side of the substrate, a microwave circuit (not shown) and a common circuit ground 145 are formed. To make connection to common circuit ground 145, via holes 150 are formed under common circuit ground 145; via holes 150 are then filled with plated metal 155 which makes physical and electrical contact with common circuit ground 145. Plated metal 155 also covers a backside of substrate 140. Plated metal 155 is to be connected to a package ground. Thus, in this structure, grounding is provided to the microwave circuit via the backside plated metal, the metal in the via holes and the common circuit ground.

The via hole structure exhibits a lower impedance than bonding wires. The structure is, however, more difficult and expensive to manufacture and as a result, it is only used where high performance is required.

It is thus an object of the present invention to provide a low impedance grounding means to a microwave circuit;

It is a further object of the present invention to provide a low impedance grounding means to a microwave circuit at low cost; and It is yet another object of the present invention to provide inexpensive low impedance grounding means to a microwave circuit which requires minimum change to existing design and fabrication steps.

SUMMARY OF THE INVENTION

The present invention provides a low impedance coupling between a ground potential and a common circuit ground of a microwave circuit using a plurality of resonators. Each of the resonators has a characteristic resonant frequency at which it displays a minimum impedance. Advantageously, the resonant frequencies of the resonators are selected and arranged such that the resonators operate to provide a low impedance band in frequency spectrum within which low impedance coupling between the common circuit ground and the ground potential is provided.

Preferably, the resonators contain only passive components such as capacitors and inductors. More preferably, each resonator includes an inductor connected in series to a capacitor, and the resonant frequency of such resonator is approximately $1/(2\pi\sqrt{LC})$ where L and C are the values of the inductor and capacitor, respectively. Most preferably, the inductor is a bond wire and the capacitor a metal-insulator-metal capacitor. In a preferred embodiment, resonators with different resonant frequencies are achieved by connecting bonding wires having approximately the same length and diameter to metal-dielectric-metal capacitors having different areas. In another preferred embodiment, the capacitors are formed on the periphery of a MMIC.

BRIEF DESCRIPTION OF THE DRAWINGS

Those and other objects, features and advantages of the present invention will be more apparent from the following detailed description in conjunction with the appended drawings in which.

DETAILED DESCRIPTION

The present invention provides a low impedance coupling between a common circuit ground and a ground potential within a pre-determined frequency band by using a low impedance coupling means. The low impedance coupling means comprises a plurality of resonators, each of which is connected between the common circuit ground and the ground potential.

Each of the resonators is characterized as exhibiting a minimum impedance at a distinct resonant frequency. Advantageously, the resonant frequencies of the resonators are arranged such that the resonators together operate to provide a low impedance band in the frequency spectrum. Within such band, a low impedance coupling between the common circuit ground and the ground potential is provided.

For the purpose of this application, a resonator refers to any device or circuit that has a frequency dependent impendance and that displays a minimum impedance when the frequency is at a resonant frequency. A resonator can contain active components such as transistors and/or passive components such as inductors and capacitors. Preferably, the resonator includes only passive components. More preferably, the resonator includes an inductor connected in series with a capacitor.

The term "low impedance" as used herein refers to impedance as it is compared with the coupling impedance using conventional bonding wires. Thus, the present invention provides within a predetermined frequency band a lower impedance coupling than that obtained by using direct wire bonding.

Figure 1A:
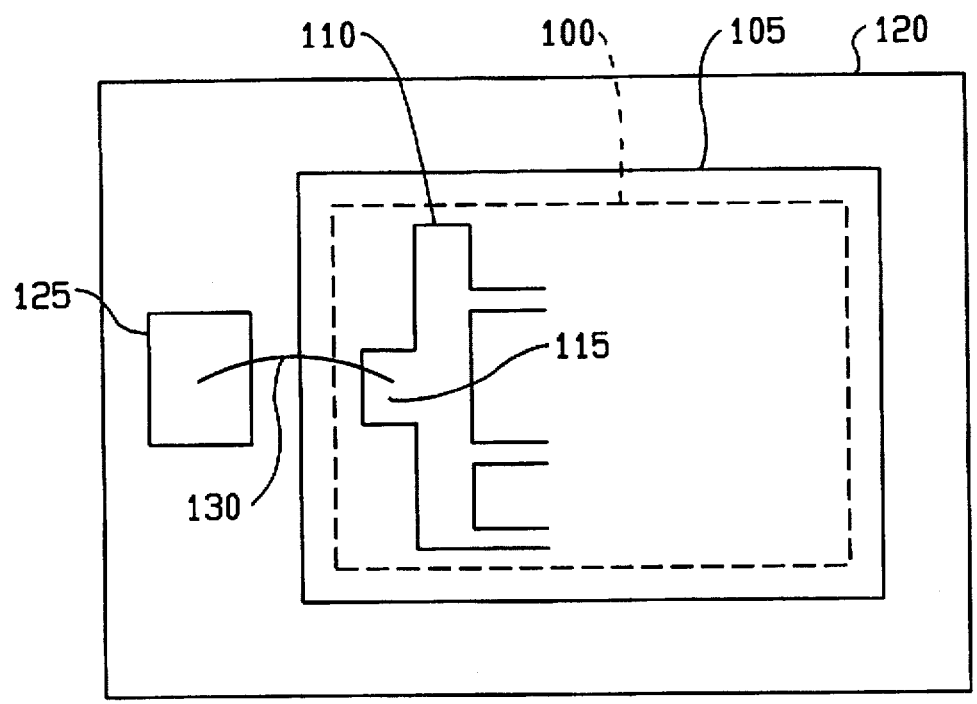
FIGS. 1A and 1B illustrate one prior art microwave device.
Figure 1C:
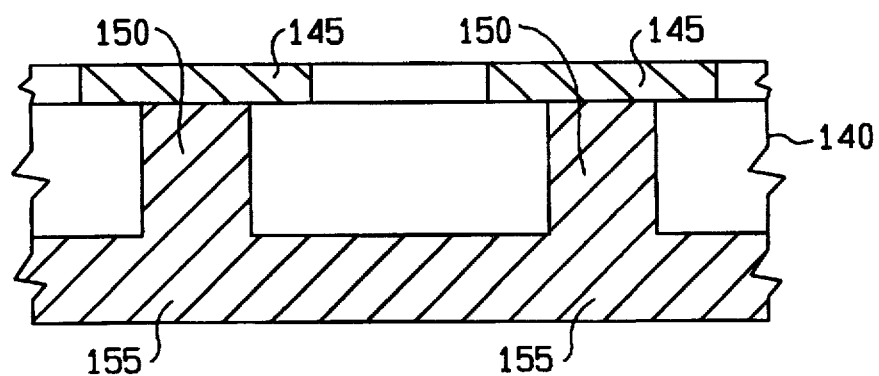
FIG. 1C illustrates another prior art microwave device.
Figure 1B:
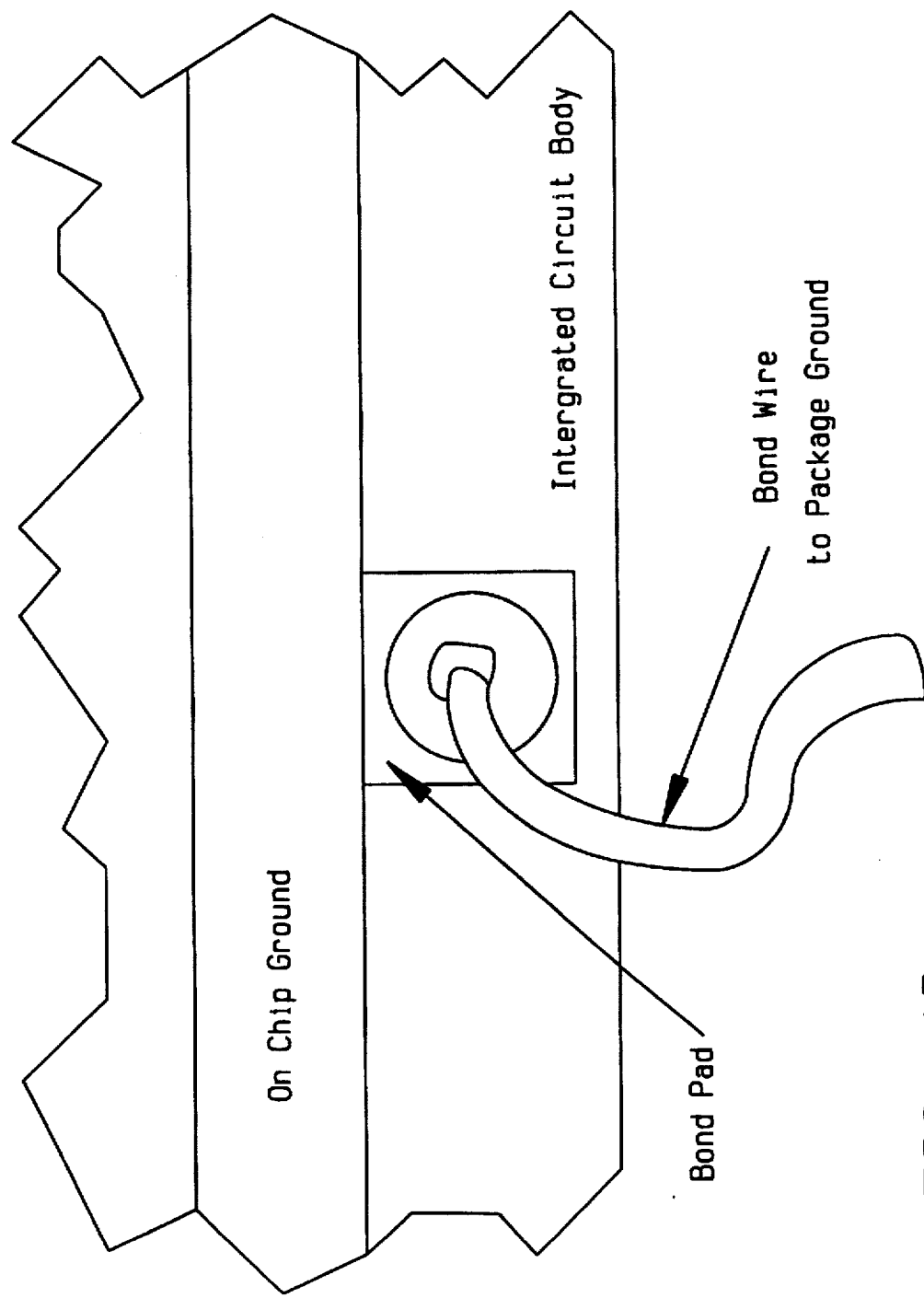
Figure 2A:
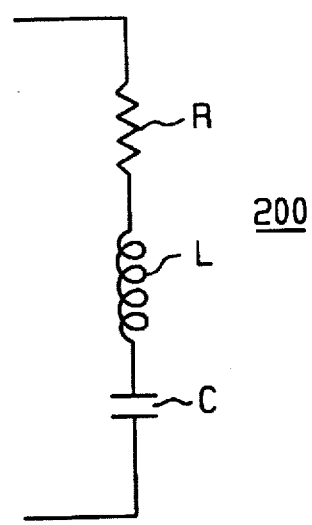
FIGS. 2A and 2B depict a resonator used in the present invention and its frequency characteristics.
Figure 2B:
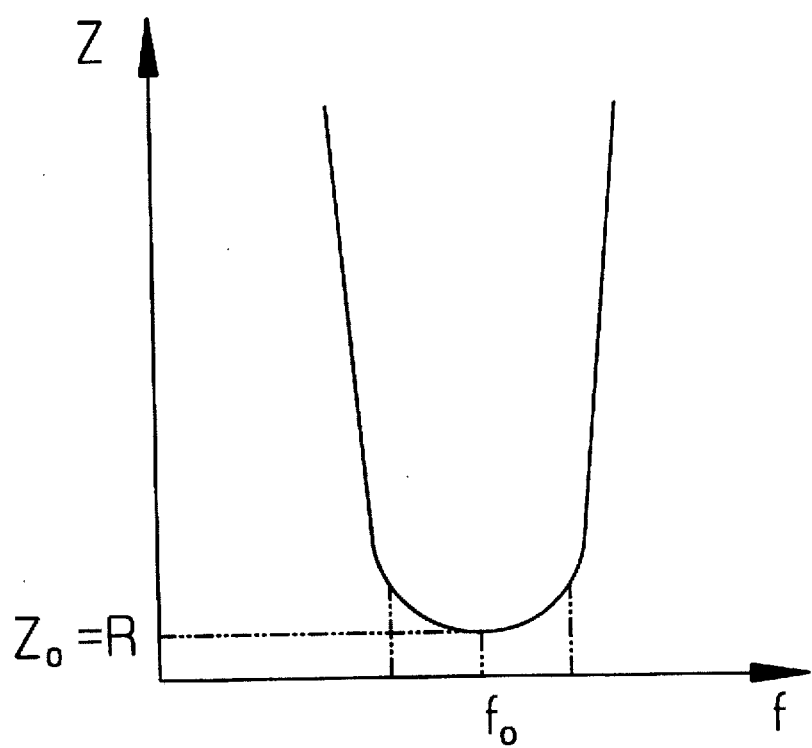

Illustrated in FIG. 2A, a simplest form of such resonator is a circuit 200 consisting of a resistor R connected in series with an inductor L and a capacitor C. The impedance of this resonator is a function of input signal frequency and it is depicted in FIG. 2B. As it is known to one of skill in the arts such resonator displays a minimum impedance of R if the input signal frequency is the resonant frequency $f_0$ of the resonator.

The impedance the resonator, Z, depicted in FIG. 2A, is a function of signal frequency f and it is represented as $$Z(f) = Z_L(f) + Z_C(f) + Z_R$$

where $Z_L(f)$, $Z_C(f)$ and $Z_R$ are the impedance of inductor L, capacitor C and resistor R, respectively. Impedance $Z_L(f)$ is $j2\pi fL$ whereas impedance $Z_c$ is $1/(j2\pi fC)$. The impedance of resistor R is R and it is independent of input signal frequency. Consequently, the impedance of the resonator is $$Z(f) = j2\pi fL + 1/(j2\pi fC) + R.$$

Based on the above equation, one can determine that the resonant frequency $f_0$ of the resonator is $1/(2\pi\sqrt{LC})$, and the impedance of the resonator at such resonant frequency is R, the resistance of the resistor.

Figure 3A:
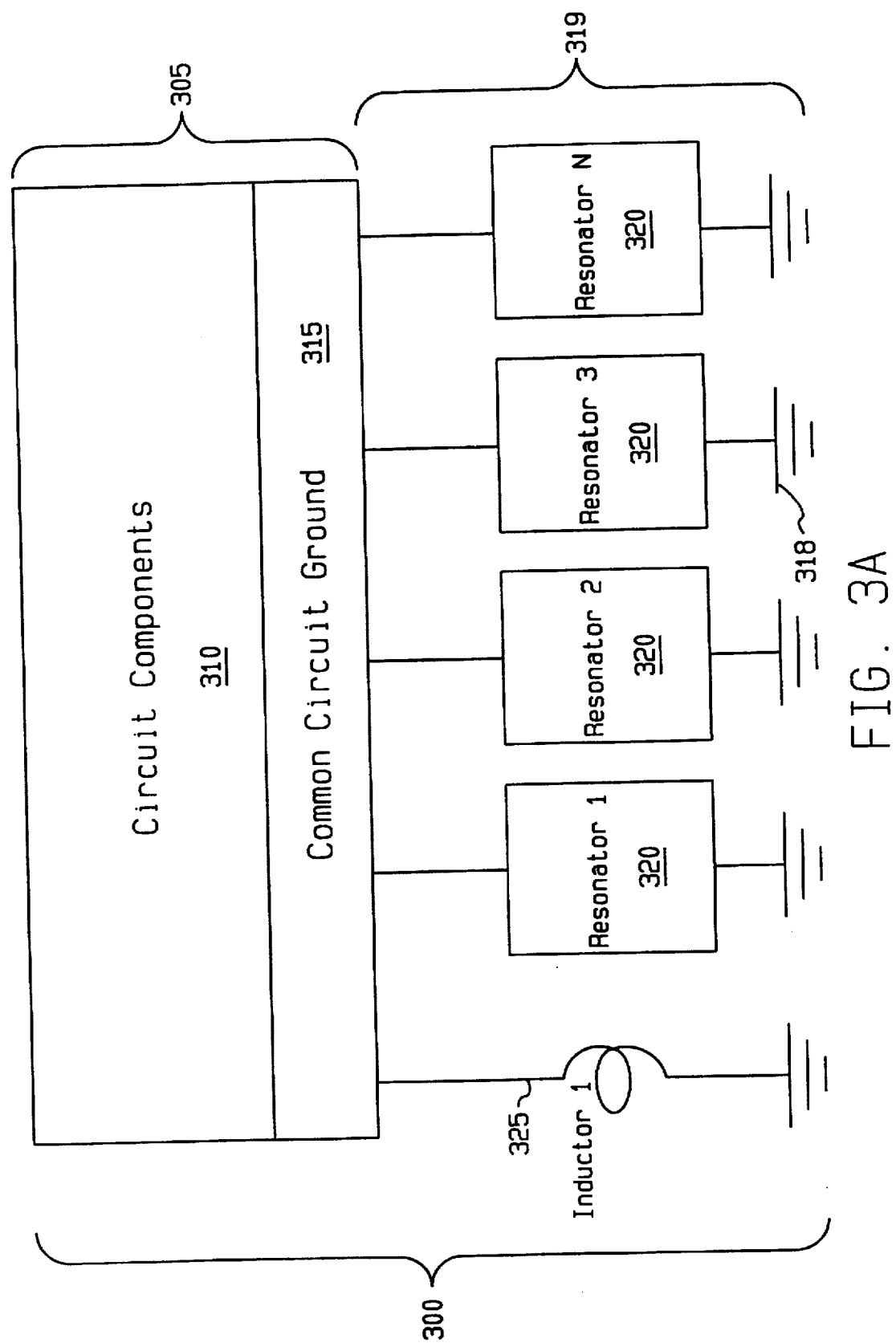
FIG. 3A is the block diagram of a preferred microwave device of the present invention.

Referring to FIG. 3A, in a preferred embodiment of the present invention, a microwave device 300 includes a microwave circuit 305 having a circuit component portion 310 connected to a common circuit ground 315. Connected between common circuit ground 315 and ground potential 318 is a low impedance coupling means 319. Low impedance coupling means 319 comprises a plurality of resonators 320 (from resonator 1 to resonator N), each connected between common circuit ground 315 and a ground potential 318. Preferably, low impedance coupling means 319 further includes an inductor 325 connected between common circuit ground and the ground potential for providing a low frequency grounding path for low frequency component such as a dc power supply.

Preferably, each of the resonators includes a capacitor connected in series with an inductor, as depicted in FIG. 2A, and it displays a minimum impedance at a characteristic resonant frequency, as shown in FIG. 2B.

Figure 3B:
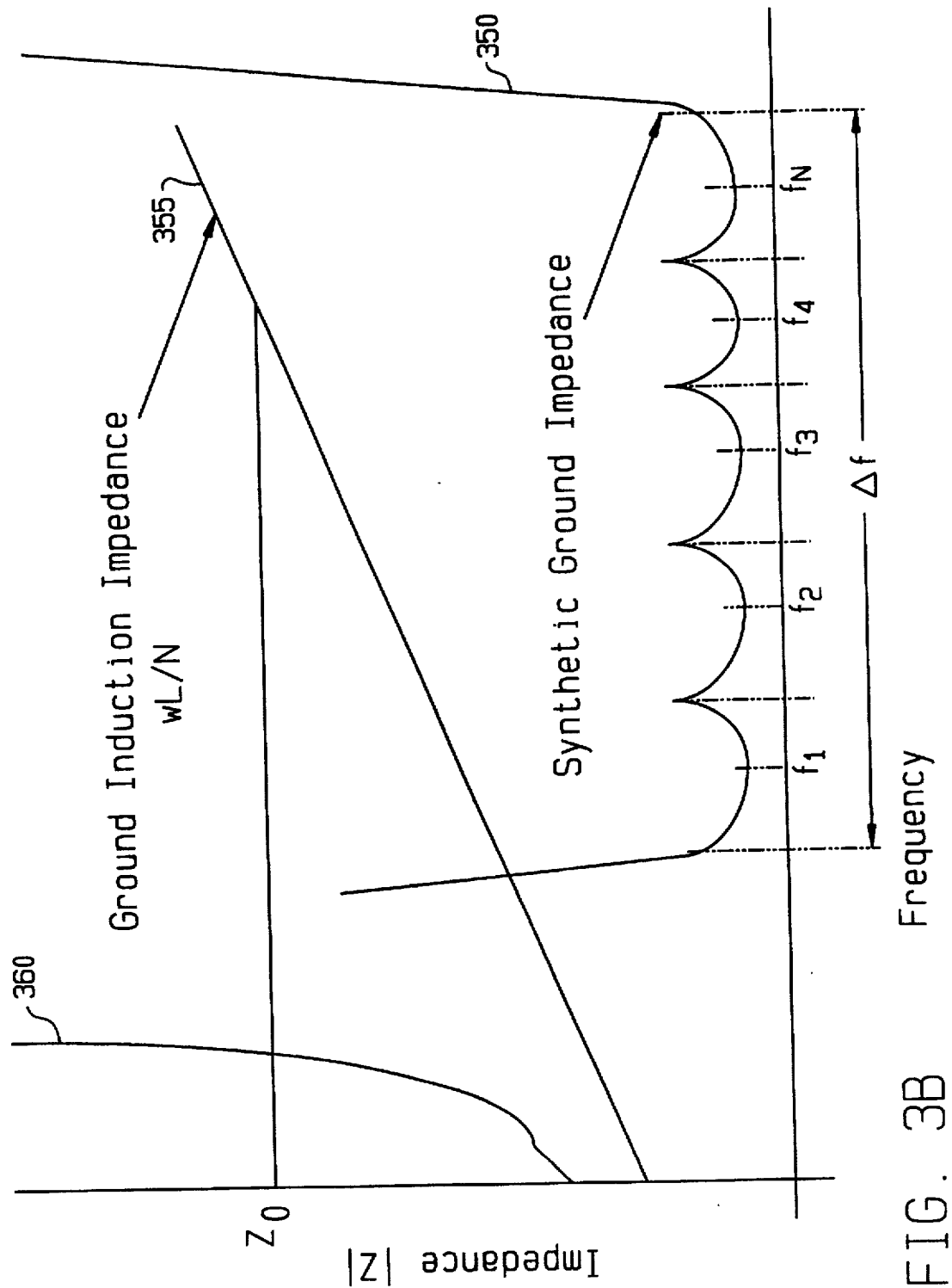
FIG. 3B is a diagram showing coupling impedance of the microwave device of the present invention as a function of signal frequency.

Referring to FIG. 3B, the resonant frequencies of the resonators, $f_1$, $f_2$ to $f_N$, are judiciously chosen such that they together form a low impedance band, $\Delta f$, in the frequency spectrum. It is noted that impedance ripples are present, which should not be a problem as long as the magnitude of the ripples is kept sufficiently low, which can be achieved by properly choosing the resonant frequencies.

There are also impedance valleys present at each resonant frequency. They are located approximately at where the resonant frequencies of individual resonators are located. The impedance at the valleys approximately equals to the resistance of the bonding wires used in the resonators.

In choosing the resonant frequencies, factors needed to be considered are (1) the low impedance band in the frequency spectrum which the circuit is to operate; (2) the amplitude of impedance ripples that is tolerable to the particular circuit; and (3) the area of the chip embodying the circuit. Clearly, more resonators having close resonant frequencies result in a smoother low impedance band with smaller impedance ripples and lower valley impedance; but it requires more resonators which occupy more area on a chip. If a broad band with low impedance is desired, it requires more resonators. Preferably, a computer simulation is performed to simulate the performance of the resonators. On the basis of the present invention, it will be apparent to one of skill in the art how to choose the number of resonators and the resonant frequencies according to one's own need to obtain a low impedance band.

Line 350 in FIG. 3B depicts impedance Z of the resonators as a function of signal frequency. In comparison, line 355 illustrates the impedance of a bonding wire as it is conventionally used to connect the common circuit ground to the ground potential. It is seen that the bonding wire exhibits a considerably greater impedance than the resonators particularly at high frequencies. In this figure, line 360 represents impedance of inductor 325 as a function of signal frequency.

Figure 3C:
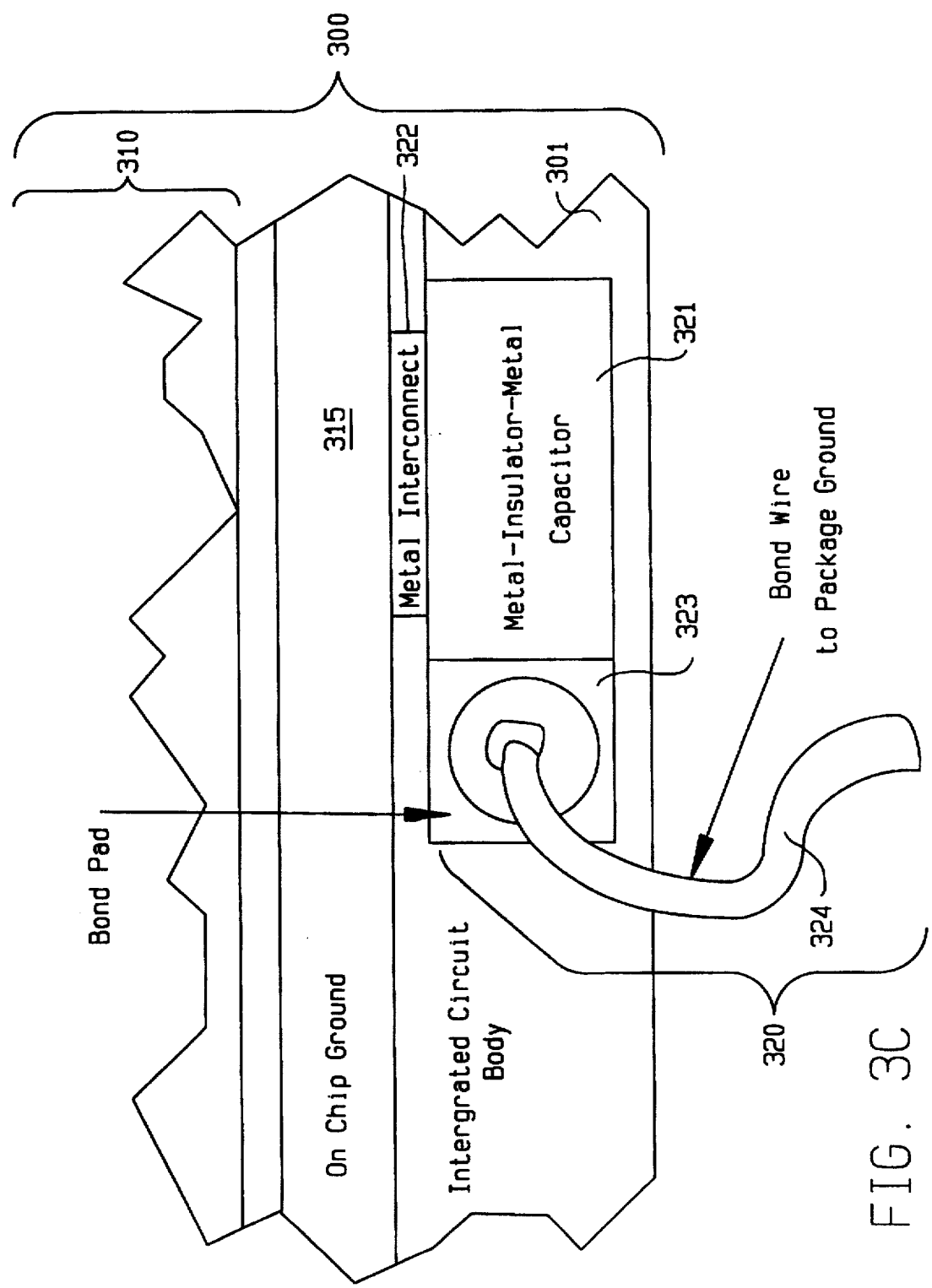
FIG. 3C is a perspective view of a resonator portion of a preferred embodiment.

FIG. 3C is an enlarged view of one of the resonators used in the preferred embodiment. Preferably, microwave circuit 305 is a GaAs MMIC formed on a semi-insulating GaAs substrate 301. Also formed on substrate 301 is a metal strip 315 as an on-chip ground. A metal-insulator-metal capacitor 321 is formed on the same substrate and it has one end connected to on-chip ground 315 through a metal interconnect 322 and the other end connected to a bonding pad 323. A bonding wire 324 connects bonding pad 323 to a package ground (not shown). Consequently, a resonator including inductive bonding wire 324 and capacitor 321 is formed.

Preferably, in designing and making the resonators, in order to obtain resonant frequencies which are different from each other, the areas of the metal-dielectric-metal capacitors are adjusted to obtain the desired resonant frequencies. The inductance of the bonding wire is approximately fixed by using the same kind of bonding wires with approximately the same length for all resonators. The capacitors are manufactured by first depositing a metal layer, then depositing and patterning a dielectric layer such as silicon dioxide or silicon nitride, and finally depositing another layer of metal on the dielectric layer. Thus, by varying the areas of the capacitors, the resonant frequencies can be changed.

In this way, a plurality of resonators are made on a chip. One advantage of the low impedance coupling means of the present invention is that it does not require substantial change of existing circuit design based on grounding provided by conventional bonding wires. Note that, in modifying existing design to include the low impedance coupling means, a central circuit component portion of the microwave circuit can be left unchanged. A designer can simply added a series of capacitors at the periphery of the chip. Another advantage is that, because of the low impedance provided by the resonators, the common circuit ground is close to the real ground potential. Consequently, circuit simulations using the common circuit ground as ground will yield more accurate results.

While the present invention has been described with reference to a preferred embodiment, it will be appreciated by those of ordinary skill in the art that modifications can be made to the structure and form of the invention without departing from its spirit and scope which is defined in the following claims.

What is claimed is:

1. A microwave device comprising:
   a microwave circuit having a common circuit ground; and
   means for coupling said common circuit ground to a ground potential,
   said means comprising a plurality of resonators connected between said common circuit ground and said ground potential, each of said plurality of resonators being characterized by a resonant frequency at which said each of said plurality of resonators exhibits a minimum impedance, and
   said plurality of resonators having resonant frequencies arranged such that they provide a low impedance band in frequency spectrum within which said means provides a low impedance coupling between said common circuit ground and said ground potential.

2. The microwave device of claim 1 wherein each of said plurality of resonators includes an inductive means connected in series with a capacitive means and has a resonant frequency of $1/(2\pi\sqrt{LC})$ where L is the inductance of said inductive means and C the capacitance of said capacitive means.

3. The microwave device of claim 2 wherein said microwave circuit is formed on a substrate, and said capacitive means is formed on said substrate and connected to said common circuit ground on one end and to said inductive means on the other end.

4. The microwave device of claim 3 wherein said inductive means includes a bonding wire connected between said capacitive means and said ground potential.

5. The microwave device of claim 4 wherein said capacitive means includes a metal-dielectric-metal capacitor connected between said bonding wire and said common circuit ground.

6. The microwave device of claim 5 wherein said plurality of resonators comprise a plurality of bonding wires and a plurality of metal-dielectric capacitors, and said plurality of resonators have different resonant frequencies obtained in part by making said plurality of capacitors having different capacitance.

7. The microwave device of claim 6 wherein said microwave circuit is a GaAs monolithic microwave and millimeter-wave integrated circuit ("MMIC").

8. The microwave device of claim 1 further comprises an additional inductive means connected between said common circuit ground and said ground potential for providing a dc ground to said microwave circuit.

9. The microwave device of claim 8 wherein said additional inductive means is a bonding wire.

10. A microwave device comprising:
    a substrate;
    a microwave circuit formed on said substrate, said microwave circuit having a common circuit ground; and
    a plurality of capacitors formed on said substrate, each of said plurality of capacitor having a first end coupled to said common circuit ground and a second end for coupling to a first end of an inductive means to form a resonator, a second end of said inductive means being coupled to a ground potential,
    said resonator being characterized by a resonant frequency at which said resonator exhibits a minimum impedance,
    said plurality of capacitors forming with a plurality of inductors a plurality of resonators, and
    said plurality of resonators having resonant frequencies arranged such that they provide a low impedance frequency band in frequency spectrum within which a low impedance coupling between said common circuit ground and said ground potential is provided.

11. The microwave device of claim 10 wherein said microwave circuit and said plurality of capacitors are monolithically integrated on said substrate.

12. The microwave device of claim 11 wherein said plurality of capacitors are metal-dielectric-metal capacitors.

13. The microwave device of claim 12 wherein said plurality of inductive means are bonding wires.

14. The microwave device of claim 13 wherein said plurality of resonators have different resonant frequencies, and said different resonant frequencies are obtained in part by making said plurality of capacitors having different capacitance.

15. A monolithic microwave device comprising:
    a semi-insulating substrate;
    a microwave circuit including a common circuit ground formed on said substrate; and
    a plurality of metal-insulator-metal capacitors formed on said substrate, each of said plurality of capacitors having a first terminal connected to said common circuit ground and a second terminal for connection to a first terminal of an inductive component, a second terminal of said inductive component being used for connection to a ground potential,
    each of said plurality of capacitors forming with said inductive component a resonator, said resonator being characterized by a distinctive resonant frequency at which said resonator exhibits a minimum impedance,
    said plurality of capacitors forming with a plurality of inductors a plurality of resonators, and
    said plurality of resonators having resonant frequencies arranged such that they provide a low impedance band in frequency spectrum within which said plurality of resonators provide a low impedance coupling between said common circuit ground and said ground potential.

16. The monolithic microwave device of claim 15 wherein said plurality of inductive components are a plurality of bonding wires.

17. The monolithic microwave device of claim 16 wherein said plurality of resonators have different resonant frequencies, and said different resonant frequencies are obtained mainly by making said plurality of capacitors having different capacitance.

18. A method for providing in a microwave circuit a low impedance coupling between a common circuit ground and a ground potential, said method comprising:

providing a plurality of resonators, coupling each of said plurality of resonators between said common circuit ground and said ground potential, designing each of said plurality of resonators to have a resonant frequency at which each of said plurality of resonators has a minimum impedance, and arranging the resonant frequencies of said plurality of resonators such that they provide a low impedance band in frequency spectrum within which said plurality of resonators provide a low impedance coupling between said common circuit ground and said ground potential.

19. The method of claim 18 wherein said plurality of resonators comprises a plurality of capacitive means connected in series with a plurality of inductive means.

20. The method of claim 19 wherein said plurality of capacitive means include metal-insulator-metal capacitors and said plurality of inductive means include bonding wires.

* * * * *